United States Patent
Gorgen

(10) Patent No.: US 6,693,449 B1
(45) Date of Patent: Feb. 17, 2004

(54) CIRCUIT AND METHOD FOR DETERMINING THE OPERATING POINT OF A SEMICONDUCTOR DEVICE

(75) Inventor: Douglas W. Gorgen, San Jose, CA (US)

(73) Assignee: Inapac Technology, Inc., San Jose, CA (US)

( * ) Notice: Subject to any disclaimer, the term of this patent is extended or adjusted under 35 U.S.C. 154(b) by 179 days.

(21) Appl. No.: 09/851,512

(22) Filed: May 8, 2001

(51) Int. Cl.[7] .............................................. G01R 31/26
(52) U.S. Cl. .................... 324/765; 324/158.1; 368/118; 368/113
(58) Field of Search ............................. 324/158.1, 765, 324/73.1; 371/260; 368/118, 113, 107, 112, 120, 130

(56) References Cited

U.S. PATENT DOCUMENTS 5,195,024 A * 3/1993 Kurokawa et al. ............ 700/23
5,247,636 A * 9/1993 Minnick et al. ............ 713/601
5,384,541 A * 1/1995 Chu et al. .................... 324/617
5,923,676 A * 7/1999 Sunter et al. ................ 714/733
6,219,305 B1 * 4/2001 Patrie et al. ................. 368/113
6,466,520 B1 * 10/2002 Speyer et al. ............... 368/118

* cited by examiner

*Primary Examiner*—Kamand Cuneo
*Assistant Examiner*—Jimmy Nguyen
(74) *Attorney, Agent, or Firm*—Sidley Austin Brown & Wood LLP

(57) ABSTRACT

A circuit and a method for determining the operating point of a semiconductor device are provided. An operating point circuit is implemented on a semiconductor device and includes a delay element that receives a first signal and produces a second signal. Since the delay changes depending on the process variation of the semiconductor device, the current temperature of the semiconductor device, and the current supply voltage supplied to the semiconductor, the delay between the first signal and the second signal can be used to determine the operating point of the semiconductor device.

20 Claims, 5 Drawing Sheets

CIRCUIT AND METHOD FOR DETERMINING THE OPERATING POINT OF A SEMICONDUCTOR DEVICE

BACKGROUND OF THE INVENTION

1. Field of the Invention

The present invention relates to a circuit and method for determining the operating point of a semiconductor device.

2. Related Art

Semiconductor devices include numerous electronic circuits. The speed at which these electronic circuits operate is dependent on the "operating point" of the semiconductor device. The operating point of a semiconductor device is dependent on the combined effect of three factors: the process variation of the semiconductor device, the temperature of the semiconductor device, and the supply voltage level for the semiconductor device.

The process variation of the semiconductor device refers to the normal variance in the structure between semiconductor devices of the same type due to variations that occur during manufacturing. Because of process variation, semiconductor devices originating from the same silicon ingot or even the same wafer often operate at different speeds. For any plurality of semiconductor devices of the same type, some devices may run at a slower than average speed, while other devices may run at a faster than average speed.

The temperature of the semiconductor device refers to its internal temperature during operation. The temperature of a semiconductor device can change while the device is operating due to heat generated within the semiconductor device or heat from external sources (e.g., power supplies).

The supply voltage of the semiconductor device refers to the voltage level of the power supply that provides power to the semiconductor device. Generally, a semiconductor device having a higher supply voltage will run faster than a device having a lower supply voltage. The supply voltage level can change while the semiconductor device is operating. For example, the supply voltage of a battery-powered device may decrease as the battery loses charge. The supply voltage can also be different if the semiconductor device is used in different applications. For example, some applications may use a 5V supply voltage whereas other applications may use a 3.3V supply voltage.

Since the operating point of a semiconductor device can vary, designers must account for the variation of a semiconductor device's operating point in their designs. This is disadvantageous because then a semiconductor device may not operate to its full capabilities. For example, a semiconductor device having a digital circuit may have the ability to operate faster at a given time, yet it must be designed to operate slower to account for potential operating point variations. Similarly, a semiconductor device having an analog circuit may have the ability to consume less current at any given time, yet it must be designed to consume a higher amount of current to account for potential operating point variations.

What is needed is a circuit and a method that can determine the operating point of a semiconductor device.

SUMMARY OF THE INVENTION

The present invention overcomes the disadvantages and limitations described above by providing a circuit and method for determining the operating point of a semiconductor device.

In one embodiment of the present invention, an operating point circuit implemented in a semiconductor device is provided. The operating point circuit includes a delay element for receiving a first signal and producing a second signal, wherein a delay between the first signal and the second signal represents an operating point of the semiconductor device.

In another embodiment of the present invention, an operating point circuit implemented in a semiconductor device is provided. The operating point circuit includes signal generating means for generating a first signal, delaying means coupled to the signal generating means for delaying the first signal by an amount of time, and counting means for generating a count representing the amount of time that the first signal is delayed by the delaying means, wherein the count is used for determining an operating point of the semiconductor device, and wherein the counting means is driven by an external clock source.

In yet another embodiment of the present invention, a method for determining the operating point of a semiconductor device is provided. The method includes providing a delay element implemented in the semiconductor device, receiving a first signal at an input of the delay element, generating a second signal at an output of the delay element, and measuring a delay between a time when the first signal is received at the input of the delay element and a time when the second signal is produced at the output of the delay element, wherein the delay is measured by a counter driven by an external clock source.

Other embodiments, aspects, and advantages of the present invention will become apparent from the following descriptions, the accompanying drawings, and the accompanying claims.

BRIEF DESCRIPTION OF THE DRAWINGS

For a more complete understanding of the present invention and for further embodiments, aspects, and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 8 of the drawings. Like numerals are used for like and corresponding parts of the various drawings.

Figure 1:
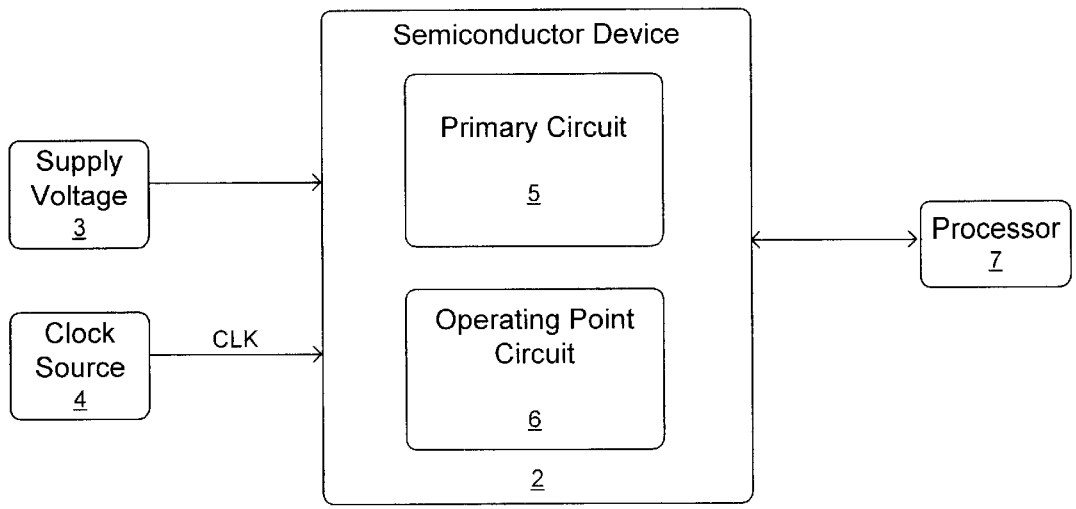
FIG. 1 is a block diagram of an exemplary semiconductor device having an exemplary operating point circuit, according to some embodiments of the present invention.

FIG. 1 is a block diagram of an exemplary semiconductor device 2 having a primary circuit 5 and an exemplary operating point circuit 6, according to some embodiments of the present invention. Operating point circuit 6 is implemented in semiconductor device 2 to determine the operating point of semiconductor device 2. Semiconductor device 2 can be a semiconductor die or a packaged semiconductor die.

Semiconductor device 2 is connected to a supply voltage 3, a clock source 4, and a processor 7. Supply voltage 3 can be any type of power source such as a power supply in a computer or a battery. Supply voltage 3 provides semiconductor device 2 with power so that it can operate. Clock source 4 can be any type of clock device such as a crystal oscillator. Clock source 4 is external to semiconductor device 2 and is less sensitive to operating point variations due to process variation, temperature, and supply voltage than primary circuit 5 and operating point circuit 6 of semiconductor device 2. Processor 7 can be any type of processing device that is capable of processing information, sending information to semiconductor device 2, and receiving information from semiconductor device 2. Although processor 7 is depicted as being an external device, processor 7 can be implemented in semiconductor device 2.

Primary circuit 5 includes one or more circuits that perform the primary function or functions of semiconductor device 2. Primary circuit 5 can include analog circuits, digital circuits, or a combination of analog and digital circuits. For example, primary circuit 5 can be a static random access memory (SRAM), a dynamic random access memory (DRAM), a microprocessor circuit, a digital-to-analog converter circuit, a transceiver circuit, or the like.

Operating point circuit 6 includes one or more circuits that allow the present operating point of semiconductor device 2 to be determined. Operating point circuit 6 acts as a sensor, sensing the combined effects of the process variation of the semiconductor device, the temperature of the semiconductor device, and supply voltage level of the semiconductor device, so that the present operating point of semiconductor device 2 can be determined. Processor 7 can then receive information representing the current operating point of semiconductor device 2 from operating point circuit 6 and use the information to adjust circuits within semiconductor device 2 or other external circuits so that the performance of semiconductor device 2 is optimized or so that the performance of the system in which semiconductor device 2 is implemented is optimized.

Figure 2:
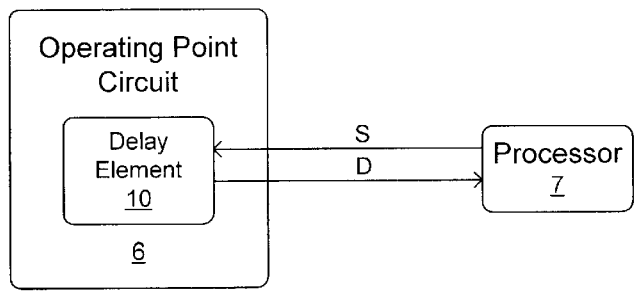
FIG. 2 is a block diagram of an exemplary operating point circuit, according to some embodiments of the present invention.

FIG. 2 is a block diagram of an exemplary operating point circuit 6, according to some embodiments of the present invention.

Operating point circuit 6 includes a delay element 10. Delay element 10 is connected to processor 7. Processor 7 generates a sample signal S. Delay element 10 receives sample signal S from processor 7, delays sample signal S, and outputs a delay signal D. Processor 7 then receives delay signal D and determines the difference between the time sample signal S was sent to delay element 10 and the time delay signal D was received from delay element 10. This time difference will change depending on the process variation of the semiconductor device, the current temperature of the semiconductor device, and the current supply voltage level supplied to the semiconductor device, and thus can be used to determine the operating point of semiconductor device 2.

Delay element 10 can be any circuit or device that mimics or is representative in some measurable way of primary circuit 5 on semiconductor device 2. For example, delay element 10 can include one or more buffers in a delay circuit, a word line in a DRAM, or an RC circuit.

Figure 3:
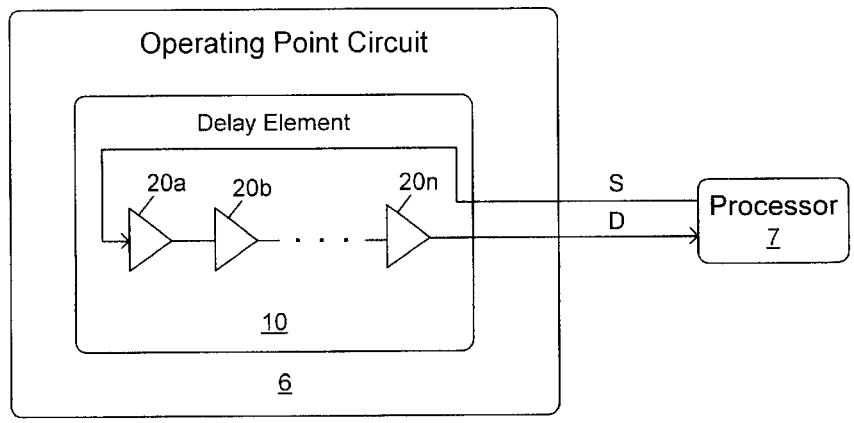
FIG. 3 is a schematic diagram of the operating point circuit of FIG. 2, according to some embodiments of the present invention.

FIG. 3 is a schematic diagram of the operating point circuit 6 of FIG. 2, according to some embodiments of the present invention. Delay element 10 includes a plurality of buffers 20 (separately labeled 20a, 20b, . . . , 20n). The number of buffers or type of buffers used is not critical so long as the combination of buffers can sufficiently delay sample signal S so that the operating point of semiconductor device 2 can be determined.

Figure 4:
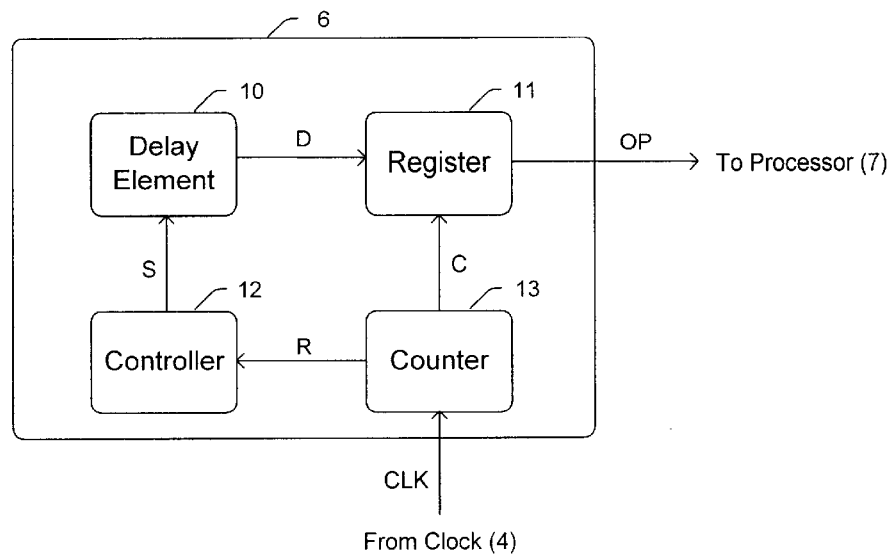
FIG. 4 is a block diagram of an exemplary operating point circuit, according to some embodiments of the present invention.

FIG. 4 is a block diagram of an exemplary operating point circuit 6, according to some embodiments of the present invention.

Operating point circuit 6 includes a delay element 10, a register 11, a controller 12, and a counter 13. Counter 13 is connected to clock source 4 and receives a clock signal CLK from clock source 4. Controller 12 is connected to counter 13 and receives a reset signal R from counter 13. Delay element 10 is connected to controller 12 and receives a sample signal S from controller 12. Register 11 is also connected to delay element 10 and receives a delay signal D from delay element 10. Register 11 is connected to counter 13 and receives a count signal C from counter 13. Register 11 is connected to processor 7 and provides an operating point signal OP to processor 7.

Controller 12 can be any type of circuit or device that is operable to receive reset signal R and operable to generate sample signal S. Controller 12 can be as simple as a single-flip flop (see FIG. 5) or as complex as a microprocessor. Counter 13 can be any type of circuit or device capable of counting, such as an up-counter, a down-counter, a shift register, or any other mechanism that generates a value or count that is proportional in some computable way to the number of clock cycles between the time sample signal S enters delay element 10 and the time delay signal D emerges from delay element 10. Register 11 can include one or more circuits or devices that are capable of storing binary information, such as one or more flip-flops, an SRAM, a sample-and-hold circuit or any other mechanism that can store the count output by counter 13. As mentioned above, delay element 10 can be any circuit or device that is representative in some measurable way of primary circuit 5 on semiconductor device 2 such as one or more buffers in a delay circuit, the word line in a DRAM, or an RC circuit.

In operation, counter 13 generates a reset signal R that causes controller to generate a sample signal S. At or about the same time counter 13 generates reset signal R, counter 13 resets and begins counting. Counter 13 continues to count and provides its current state or count to register 11 via count signal C. Count signal C typically includes a plurality of binary signals (not shown) that represent the current count of counter 13. Delay element 10 receives sample signal S from controller 12, delays sample signal S, and outputs a delay signal D. Delay signal D is a delayed version of sample signal S. When register 11 receives delay signal D, the current count of counter 13 is latched in register 11. The latched count of counter 13 represents the difference between the time sample signal S was sent to delay element 10 and the time delay signal D was received from delay element 10. This time difference will change depending on the process variation of the semiconductor device, the current temperature of the semiconductor device, and the current supply voltage level supplied to the semiconductor device, and thus can be used to determine the operating point of semiconductor device 2. Processor 7 can then read the stored count in register 11 via operating point signal OP. Operating point signal OP represents the count stored in register 11, which is a binary value that can be used to determine the operating point of semiconductor device 2.

Figure 5:
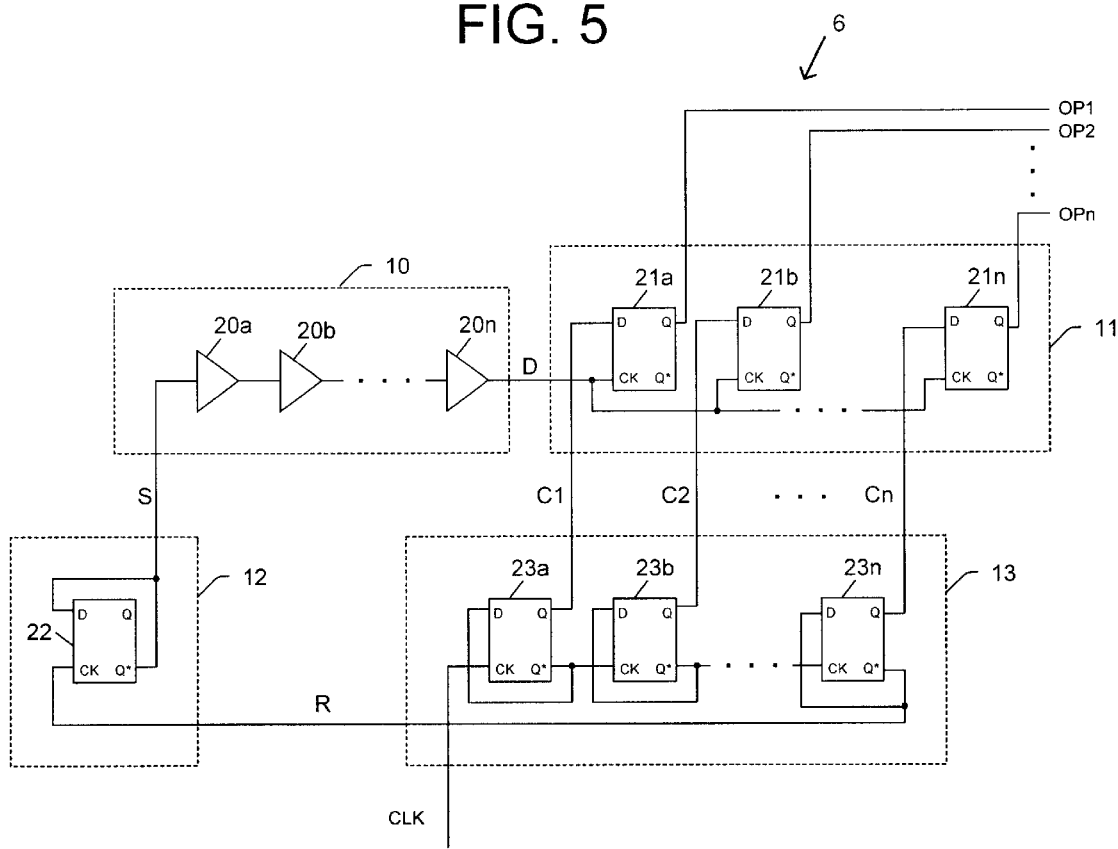
FIG. 5 is a schematic diagram of the operating point circuit of FIG. 4, according to some embodiments of the present invention.

FIG. 5 is a schematic diagram of the operating point circuit 6 of FIG. 4, according to some embodiments of the present invention.

Operating point circuit 6 includes delay element 10, register 11, controller 12, and counter 13. Controller 12 includes a flip-flop (FF) 22. The clock input CK of FF 22 is connected to counter 13 to receive the reset signal R. The complement output Q* of FF 22 is connected to the input D of FF 22. The signal at complement output Q* of FF 22 is output as the sample signal S.

Delay element 10 includes a plurality of buffers 20 (separately labeled 20a, 20b, . . . , 20n). The input of buffer 20a is connected to complement output Q* of FF 22 of controller 12. As such, buffer 20a receives sample signal S as an input signal. The output of buffer 20a is connected to the input of buffer 20b. The output of buffer 20b is connected to the input of buffer 20c (not shown) and so on. The signal output of buffer 20n is output as delay signal D.

Register 11 can be an n-bit register which includes a plurality of FFs 21 (separately labeled 21a, 21b, . . . , 21n). The input D of FF 21a is connected to receive a first bit count signal C1 from counter 13. The output Q of FF 21a provides the least significant bit operating point signal OP1. The input D of FF 21b is connected to receive a second bit count signal C2 from counter 13. The output Q of FF 21a provides a second bit operating point signal OP2. FFs 21c, . . . , 21n are connected in a manner similar to that of FFs 21a and 21b. The output Q of FF 21n provides the most significant bit operating point signal OPn. Collectively, bit operating point signals OP1 through OPn form n-bit operating point signal OP.

Counter 13 can be an n-bit counter which includes a plurality of FFs 23 (separately labeled 23a, 23b, . . . , 23n). The clock input CK of FF 23a is connected to clock source 4 to receive a clock signal CLK. The input D of FF 23a is connected to its own complement output Q*. The output Q of FF 23a is connected to the input D of FF 21a of register 11. The signal from output Q of FF 23a is output as first bit count signal C1. The clock input CK of FF 23b is connected to the complement output Q* of FF 23a. The input D of FF 23b is connected to its own complement output Q*. The output Q of FF 23b is connected to the input D of FF 21b of register 11. The signal from output Q of FF 23b is output as second bit count signal C2. FFs 23c, . . . , 23n are connected in a manner similar to that of FFs 23a and 23b except that the complement output Q* of FF 23n is connected to the clock CK input of FF 22 of controller 12. The signal at complement output Q* of FF 23n is output as the reset signal from counter 13. The signals at the outputs Q of FFs 23c–23n are output as the third through n bit count signals C3 through Cn, respectively. Collectively, bit count signals C1 through Cn form n-bit count signal C.

In operation, counter 13 generates a reset signal R, taken at output Q* of FF 23n, when counter 13 rolls over. Counter 13 begins counting from zero at this time. Counter 13 continues to count and provides its current state or count to register 11 via bit count signals C1 through Cn. C1 represents the least significant bit of the current count and Cn represents the most significant bit of the current count. The count is incremented each time a clock signal CLK is received.

When controller 12 receives reset signal R at the clock input CK of FF 22, it generates sample signal S. The input of buffer 20a of delay element 10 receives sample signal S. Sample signal S then propagates through each buffer 20 in delay element 10 and exits buffer 20n as delay signal D. Delay signal D is a delayed version of sample signal S. Each FF 21 of register 11 then receives delay signal D at their respective clock inputs CK causing the current value of count signals Cn to be latched or stored in FFs 21. The current value of bit count signals C1 through Cn represents the difference between the time sample signal S was sent to delay element 10 and the time delay signal D was received from delay element 10. As noted above, this time difference will change depending on the process variation of the semiconductor device 2, the current temperature of the semiconductor device 2, and the current supply voltage level supplied to the semiconductor device 2, and thus can be used to determine the operating point of semiconductor device 2. Processor 7 can then read the stored count in register 11 via bit operating point signals OP1 through OPn. Operating point signals OP1 through OPn represent the count stored in register 11, which is a binary representation of the operating point of semiconductor device 2.

Those skilled in the art will recognize that operating point circuit 6 of FIG. 5 is merely illustrative and that many other circuits can be used to determine the operating point of a semiconductor device, all of which are within the scope of the present invention. Operating point circuit 6 of FIG. 5 is a relatively simple design since it uses a simple controller 12 (i.e., a single flip-flop) and a simple "free running" counter 13 (i.e., the counter can not be reset or stopped). More sophisticated controllers and counters can be used in an operating point circuit of the present invention. For example, a more sophisticated controller could detect the zero value of the counter and immediately initiate another operating point measurement cycle by generating a sample signal S. An even more sophisticated controller could use delay signal D to force counter to zero and immediately initiate another operating point measurement cycle by generating a sample signal S. In this case, the counter is a pre-settable counter.

Figure 6:
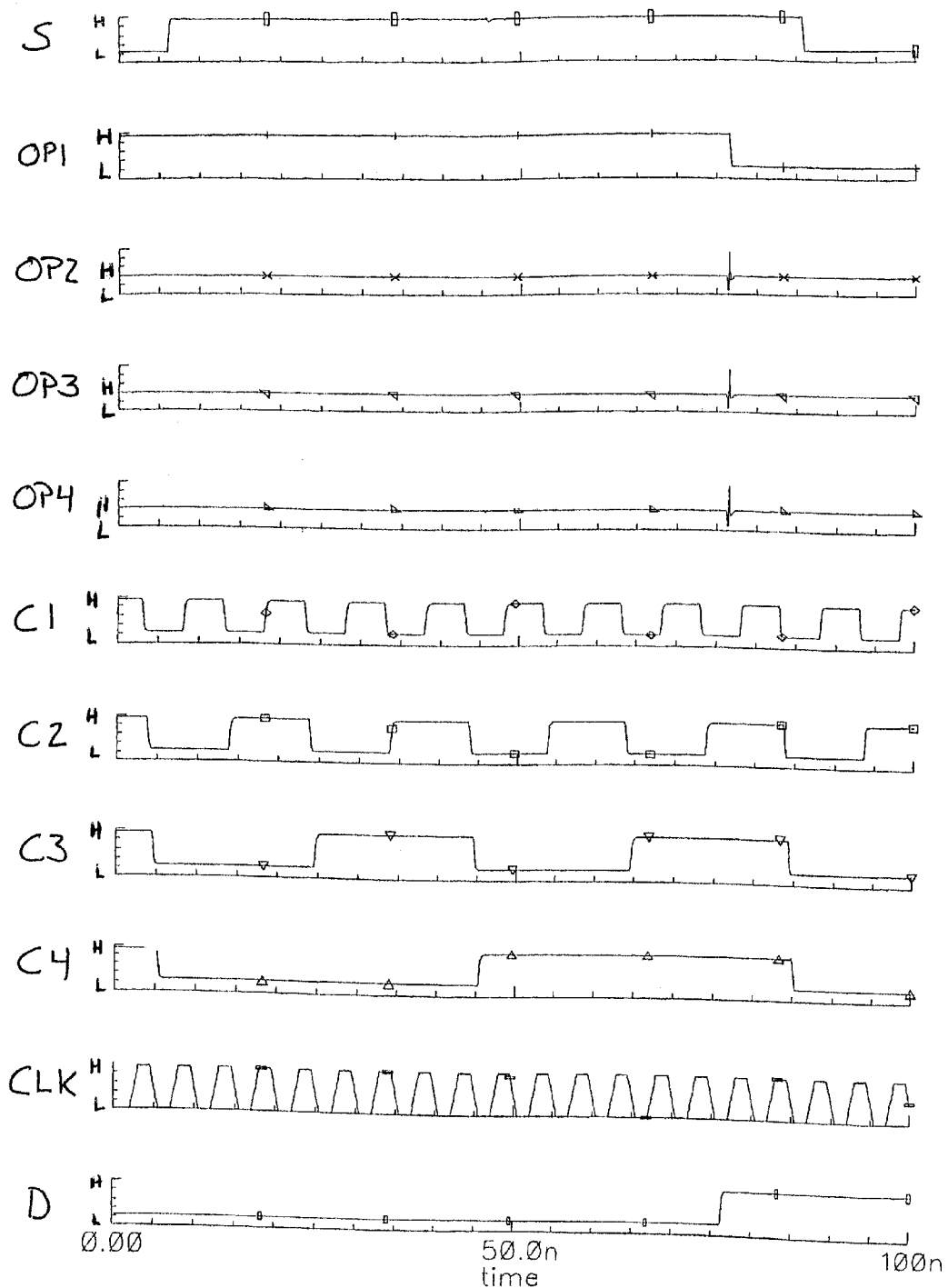
FIG. 6 is an exemplary timing diagram for the operating point circuit of FIG. 5 when the operating point is slower than typical.
Figure 7:
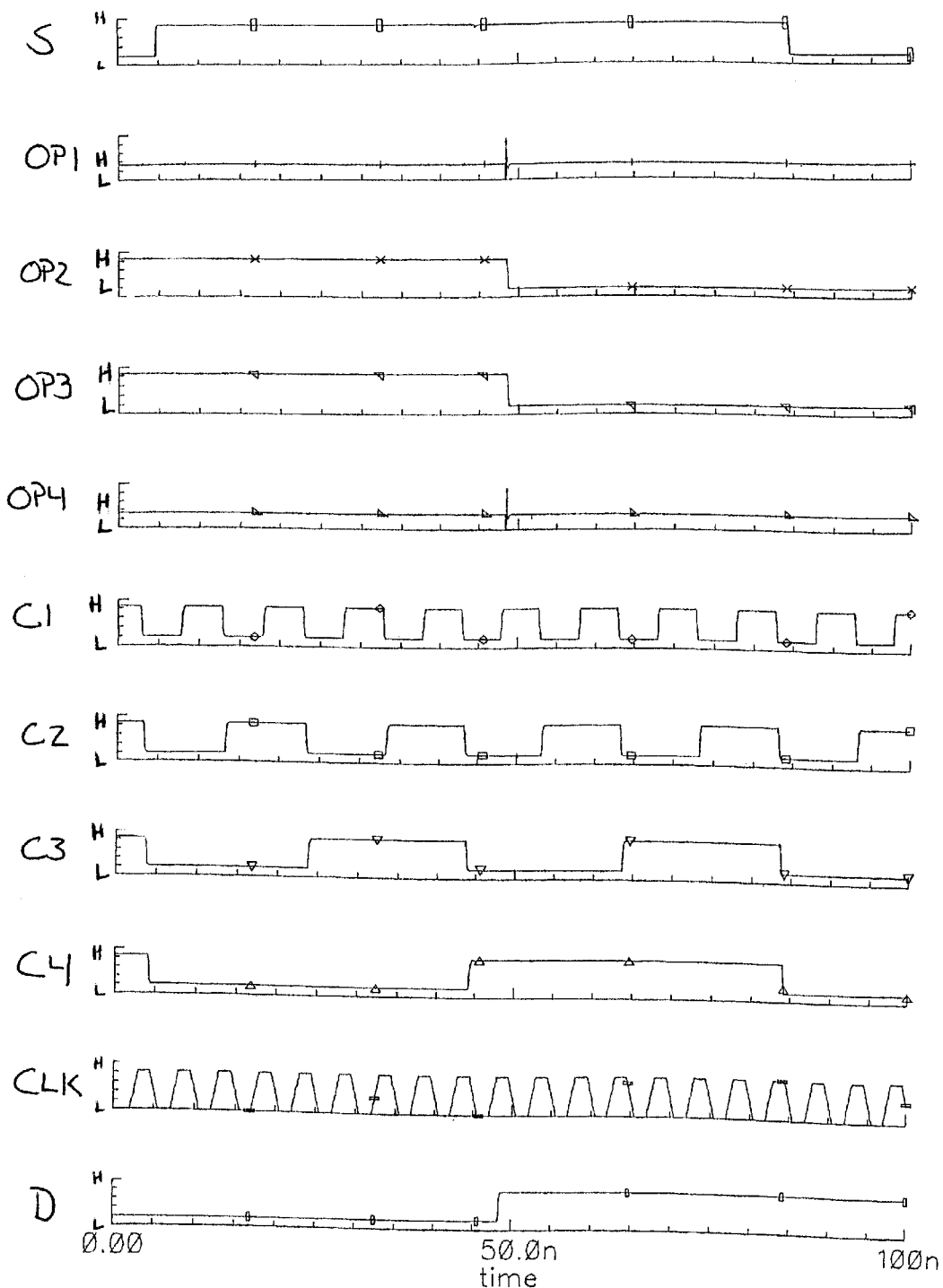
FIG. 7 is an exemplary timing diagram for the operating point circuit of FIG. 5 when the operating point is typical.
Figure 8:
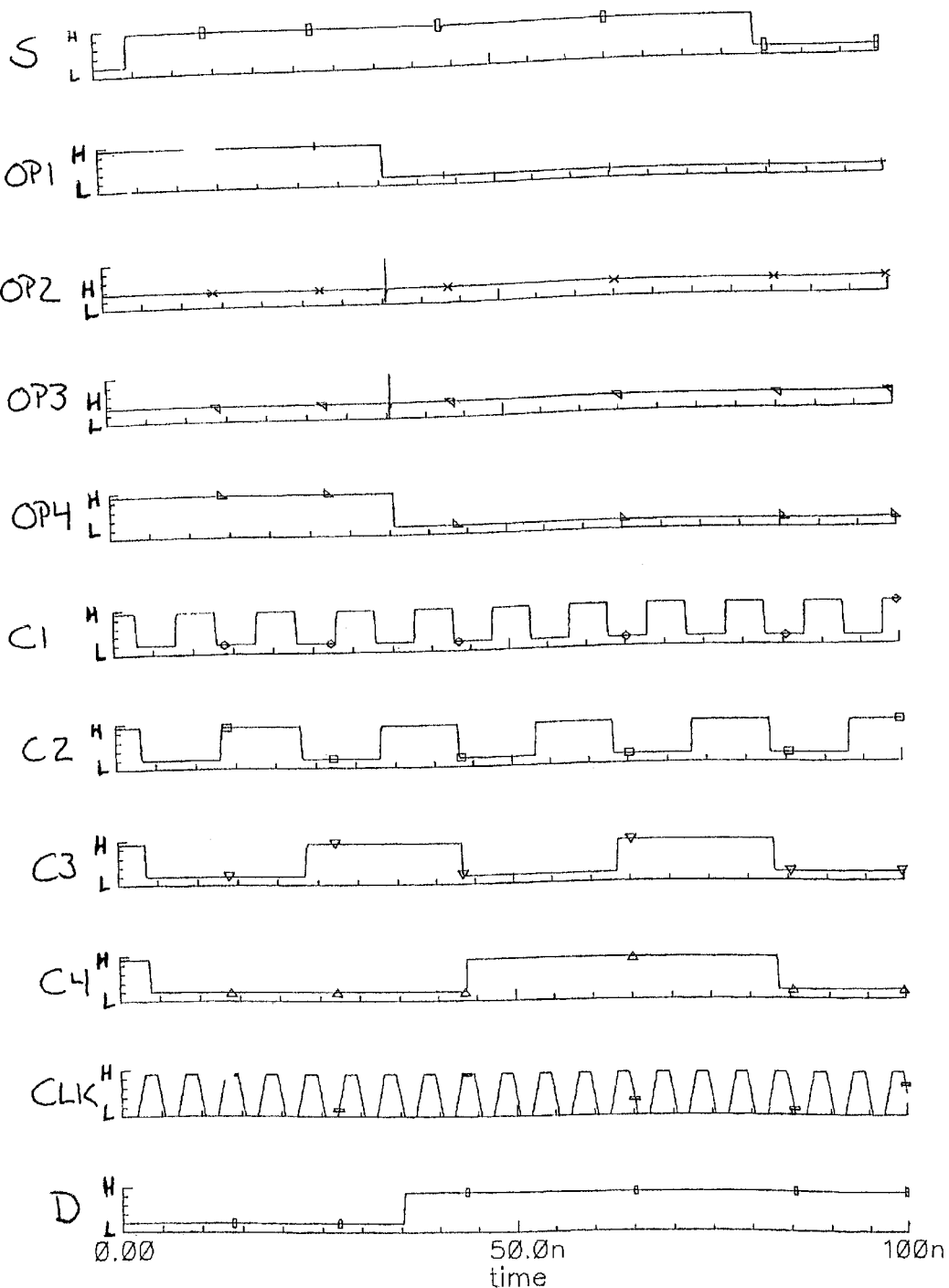
FIG. 8 is an exemplary timing diagram for the operating point circuit of FIG. 5 when the operating point is faster than typical.

FIGS. 6, 7, and 8 are timing diagrams that illustrate how the operating point of a semiconductor device 2 can be determined using the exemplary operating point circuit 6 of FIG. 5. FIG. 6 shows a timing diagram for operating point circuit 6 of FIG. 5 when the operating point is slower than typical (i.e., the semiconductor device is slower than a typical device due to process variation, the current temperature is higher than typical, and/or the supply voltage is lower than typical). FIG. 7 shows a timing diagram for operating point circuit 6 of FIG. 5 when the operating point is typical (i.e., the semiconductor device a typical device, the current temperature is typical, and/or the supply voltage is typical). FIG. 8 shows a timing diagram for operating point circuit FIG. 5 when the operating point is faster than typical (i.e., the semiconductor device is faster than a typical device due to process variation, the current temperature is lower than typical, and/or the supply voltage is higher than typical).

FIGS. 6, 7, and 8 assume that register 11 is implemented as a 4-bit register and counter 13 is implemented as a 4-bit counter. Thus, there are four bit count signals C1 through C4 and there are four operating point signals OP1 through OP4. Sample signal S is shown as waveform S, operating point signals OP1 through OP4 are shown as waveforms OP1 through OP4, bit count signals C1 through C4 are shown as waveforms C1 through C4, clock signal CLK is shown as waveform CLK, and delay signal D is shown as waveform D. The reference characters "H" and "L" indicate a logic high signal and a logic low signal, respectively.

Referring to FIGS. 5, 6, 7, and 8, operation begins when counter 13 rolls over to zero (i.e., each of bit count signals have a value of zero or binary 0000). At this time, reset signal R (not shown on FIGS. 6, 7, and 8) is enabled which causes sample signal S to be generated. Sample signal S then propagates through delay element 10. At this time counter 13 is counting. When sample signal S finally propagates through delay element 10, delay signal D is generated. Note that delay signal is generated at approximately 76 ns for the slow operating point case (FIG. 6), at approximately 48 ns for the typical operating point case (FIG. 7), and at approximately 36 ns for the fast operating point case (FIG. 8). Delay signal D then latches the current value of the bit count signals C1 through C4 in register 11. The latched count is binary 1110 or decimal 14 for the slow operating point case (FIG. 6), binary 1001 or decimal 9 for the typical operating point case (FIG. 7), and binary 0110 or decimal 6 for the fast operating point case (FIG. 8).

Processor 7 can then read the count values stored in register 11 to determine the operating point of semiconductor device 2. Processor 7 can then use this information to adjust one or more circuits (e.g., in primary circuit 5) on semiconductor device 2. For example, if the operating point is such that semiconductor device 2 is running slow, the processor 7 can adjust current sources or other devices to optimize the performance of semiconductor device 2. If the operating point is such that semiconductor device 2 is running fast, processor 7 can adjust current sources or other devices to optimize the performance of semiconductor device 2.

Advantages of the Present Invention

From the above description, it should be apparent that the present invention provides at least the following advantages. First, the present invention allows the operating point of semiconductor devices to be monitored in real-time. Adjustments can then be made to circuits within the semiconductor device to optimize the performance of the semiconductor device. For example, an output driving circuit in a semiconductor device may be operating too fast, causing the output signals to "ring." The present invention can be used to detect when the output driving circuit is operating too fast. If the output driving circuit is operating too fast, one or more control signals can be sent to the output circuit causing the output circuit to operate slower. Second, the present invention could be used as a test circuit during a manufacturing process to determine the speed of the device. Devices can then be sorted according to their speeds.

While particular embodiments of the present invention and their advantages have been shown and described, it should be understood that various changes, substitutions, and alterations can be made therein without departing from the spirit and scope of the invention as defined by the appended claims. For example, skilled artisans will recognize that the exemplary operating point circuits 6 shown and described are merely examples and that many different circuits can be used to implement the present invention.

What is claimed is:

1. An operating point circuit implemented in a semiconductor device, the operating point circuit comprising:
    a delay element for receiving a sample signal and producing a delay signal, wherein the difference between the time the sample signal is received by the delay element and when the delay signal is produced by the delay element represents an operating point of the semiconductor device, wherein the difference in time is measured in terms of a number of clock cycles of a clock source that is external to the semiconductor device.

2. The operating point circuit of claim 1 wherein the difference in time is measured by a counter driven by the clock source that is external to the semiconductor device.

3. The operating point circuit of claim 1 further comprising:
    a controller coupled to the delay element and operable to generate the sample signal.

4. The operating point circuit of claim 1 further comprising:
    a register coupled to the delay element and operable to store a value representing the difference in time.

5. The operating point circuit of claim 1 further comprising:
    a counter operable to generate a count representing the difference in time; and
    a register coupled to the delay element and the counter, the register operable to store the count in response to the delay signal.

6. The operating point circuit of claim 1 wherein the delay element includes a plurality of buffers.

7. The operating point circuit of claim 1 wherein the difference in time changes depending on a process variation of the semiconductor device, a temperature of the semiconductor device, and a supply voltage level supplied to the semiconductor device.

8. The operating point circuit of claim 1 wherein the semiconductor device includes a primary circuit having analog and/or digital circuits.

9. An operating point circuit implemented in a semiconductor device, the operating point circuit comprising:
    signal generating means for generating a sample signal;
    delaying means coupled to the signal generating means for delaying the sample signal by an amount of time; and
    counting means for generating a count representing the amount of time that the sample signal is delayed by the delaying means, wherein the count is used for determining an operating point of the semiconductor device, and wherein the count comprises a number of clock cycles of an external clock source.

10. The operating point circuit of claim 9 further comprising:
    registering means coupled to the delaying means and the counting means, the registering means for storing the count.

11. The operating point circuit of claim 9 wherein the delaying means includes a plurality of buffers.

12. The operating point circuit of claim 9 wherein the operating point of the semiconductor device changes depending on a process variation of the semiconductor device, a temperature of the semiconductor device, and a supply voltage level supplied to the semiconductor device.

13. The operating point circuit of claim 9 wherein the semiconductor device includes a primary circuit having analog and/or digital circuits.

14. A method for determining the operating point of a semiconductor device, the method comprising:
    providing a delay element implemented in the semiconductor device;
    receiving a sample signal at an input of the delay element;
    generating a delay signal at an output of the delay element; and
    measuring a difference in time between when the sample signal is received at the input of the delay element and when the delay signal is produced at the output of the delay element, wherein the difference in time is measured in terms of a number of clock cycles of an external clock source.

15. The method of claim 14 further comprising:
generating the sample signal at a controller.

16. The method of claim 14 wherein measuring comprises generating a count which represents the difference in time between the sample signal and the delay signal.

17. The method of claim 14 further comprising:
storing a value representing the difference in time in a register.

18. The method of claim 14 wherein the delay element includes a plurality of buffers.

19. The method of claim 14 wherein the operating point of the semiconductor device changes depending on a process variation of the semiconductor device, a temperature of the semiconductor device, and a supply voltage level supplied to the semiconductor device.

20. The method of claim 14 wherein the semiconductor device includes a primary circuit having analog and/or digital circuits.

* * * * *